US011910561B2

(12) United States Patent
Duke et al.

(10) Patent No.: US 11,910,561 B2
(45) Date of Patent: Feb. 20, 2024

(54) COOLED WIRELESS MOBILE DEVICE CHARGER

(71) Applicant: Polaris Industries Inc., Medina, MN (US)

(72) Inventors: Benjamin D. Duke, Beaver Dam, WI (US); Walter B. Ross, Middlebury, IN (US); Benoit J. Renaud, Elkhart, IN (US); Robert J. Wachs, Jr., Edwardsburg, MI (US)

(73) Assignee: Polaris Industries Inc., Medina, MN (US)

( * ) Notice: Subject to any disclaimer, the term of this patent is extended or adjusted under 35 U.S.C. 154(b) by 60 days.

(21) Appl. No.: 17/584,484

(22) Filed: Jan. 26, 2022

(65) Prior Publication Data

US 2022/0240412 A1    Jul. 28, 2022

Related U.S. Application Data

(60) Provisional application No. 63/142,052, filed on Jan. 27, 2021.

(51) Int. Cl.
| | |
|---|---|
| *H05K 7/20* | (2006.01) |
| *H02J 7/02* | (2016.01) |
| *H02J 7/00* | (2006.01) |
| *B60H 1/00* | (2006.01) |

(52) U.S. Cl.
CPC ..... *H05K 7/20172* (2013.01); *B60H 1/00271* (2013.01); *H02J 7/0044* (2013.01); *H02J 7/02* (2013.01); *H05K 7/2039* (2013.01)

(58) Field of Classification Search
CPC ............. H05K 7/20172; H05K 7/2039; B60H 1/00271; H02J 7/0044; H02J 7/02
See application file for complete search history.

(56) References Cited

U.S. PATENT DOCUMENTS

| | | | |
|---|---|---|---|
| 9,142,976 B2* | 9/2015 | Chen ..................... | H04B 5/0037 |
| 10,298,052 B1* | 5/2019 | Bona .................. | H02J 7/007192 |
| 11,329,497 B2* | 5/2022 | Wippler .................. | H02J 50/90 |
| 2007/0152633 A1* | 7/2007 | Lee ........................ | G06F 1/1632 |
| | | | 320/114 |
| 2013/0234656 A1* | 9/2013 | Lambert ............... | H02J 7/0042 |
| | | | 320/108 |
| 2014/0293538 A1* | 10/2014 | Han ........................ | H02J 50/90 |
| | | | 361/690 |
| 2018/0224909 A1* | 8/2018 | Koo ....................... | H02J 50/10 |

(Continued)

*Primary Examiner* — Michael A Matey
(74) *Attorney, Agent, or Firm* — Faegre Drinker Biddle & Reath LLP

(57) ABSTRACT

Aspects of the present disclosure relate to a cooled wireless mobile device charger. As an example, a cooling enclosure is provided, comprising a cooling surface. The cooling enclosure may shield a mobile device therein from direct sunlight or other adverse conditions, thereby reducing the heat exposure of the device. The cooling surface may comprise a thermoelectric cooling element or any of a variety of other cooling means. Additionally, the cooling surface may be angled about a lateral axis to enable a user to more easily view at least a part of the mobile device (e.g., in a landscape or portrait orientation) while the device is in the cooling enclosure. In some instances, a detachable visor is provided that further shields the mobile device from sunlight. As another example, the visor may retract within the cooling enclosure.

20 Claims, 7 Drawing Sheets

(56) References Cited

U.S. PATENT DOCUMENTS

| | | | |
|---|---|---|---|
| 2020/0021125 A1* | 1/2020 | Thiel | H02J 7/0044 |
| 2020/0091755 A1* | 3/2020 | Larsson | H02J 7/0044 |
| 2021/0161034 A1* | 5/2021 | Jeong | G06F 1/1632 |
| 2021/0267098 A1* | 8/2021 | Wippler | H02J 7/00309 |

* cited by examiner

COOLED WIRELESS MOBILE DEVICE CHARGER

CROSS-REFERENCE TO RELATED APPLICATION

This application claims priority to U.S. Provisional Application No. 63/142,052, titled "Cooled Wireless Mobile Device Charger," filed on Jan. 27, 2021, the entire disclosure of which is hereby incorporated by reference in its entirety.

BACKGROUND

Mobile devices may enter a protective operating mode in response to one or more adverse conditions. For example, if the mobile device is exposed to sunlight and/or heat for an extended period of time, the mobile device may reduce screen brightness and/or function at a reduced level of computing power to avoid overheating. However, this may negatively affect a user's experience, especially in instances where such adverse conditions are likely to be encountered with greater frequency, as may be the case when engaging in various outdoor activities or engaging in powersports.

It is with respect to these and other general considerations that embodiments have been described. Also, although relatively specific problems have been discussed, it should be understood that the embodiments should not be limited to solving the specific problems identified in the background.

SUMMARY

Aspects of the present disclosure relate to a cooled wireless mobile device charger. As an example, a cooling enclosure is provided, comprising a cooling surface. The cooling enclosure may shield a mobile device therein from direct sunlight or other adverse conditions, thereby reducing the heat exposure of the device. The cooling surface may comprise a thermoelectric cooling element or any of a variety of other cooling means. Additionally, the cooling surface may be angled about a lateral axis to enable a user to more easily view at least a part of the mobile device (e.g., in a landscape or portrait orientation) while the device is in the cooling enclosure. In some instances, a detachable visor is provided that further shields the mobile device from sunlight. As another example, the visor may retract within the cooling enclosure.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

BRIEF DESCRIPTION OF THE DRAWINGS

Non-limiting and non-exhaustive examples are described with reference to the following Figures.

DETAILED DESCRIPTION

Figure 1A:
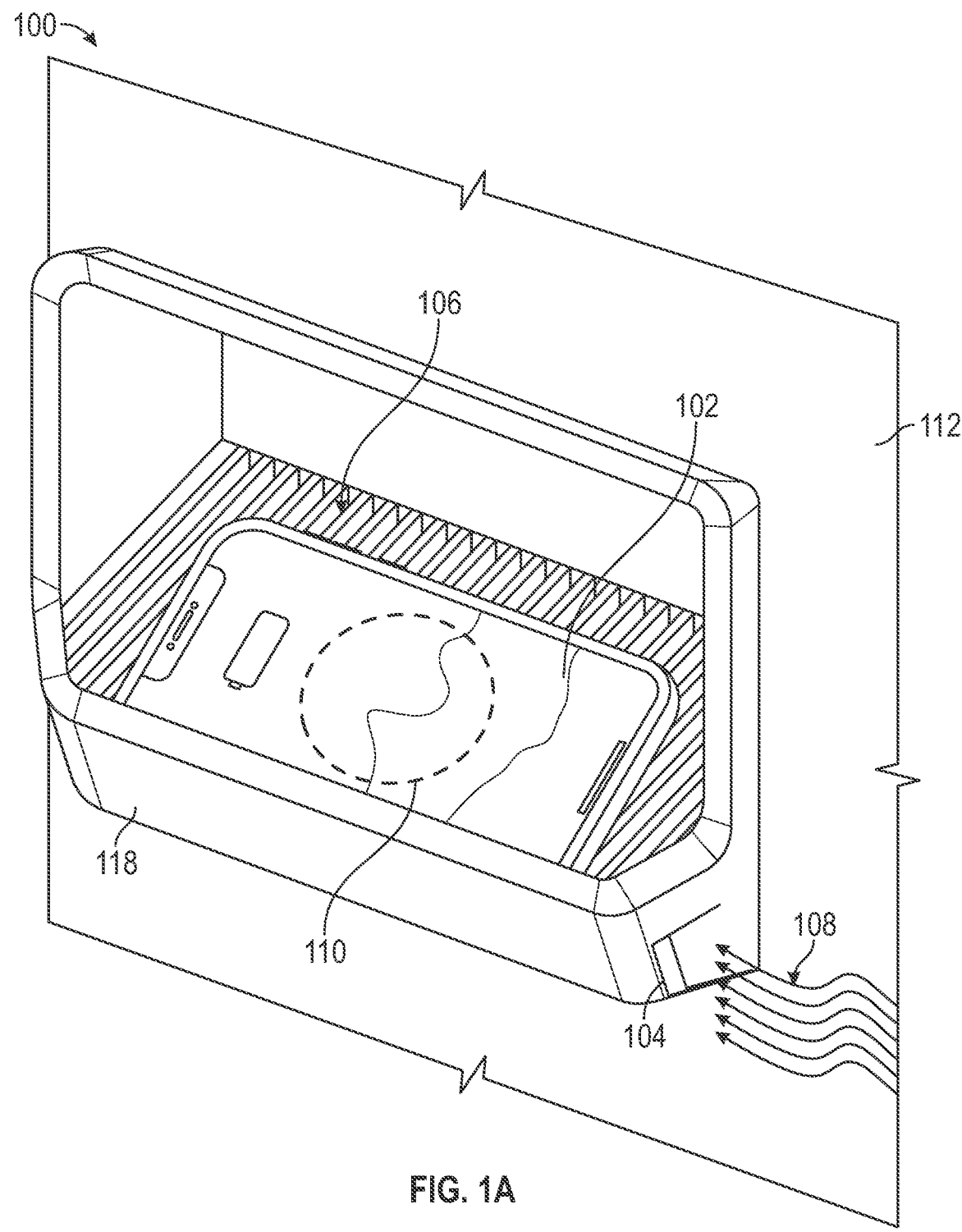
FIG. 1A illustrates a front perspective view of a cooling enclosure according to aspects described herein.

In the following detailed description, references are made to the accompanying drawings that form a part hereof, and in which are shown by way of illustrations specific embodiments or examples. These aspects may be combined, other aspects may be utilized, and structural changes may be made without departing from the present disclosure. Embodiments may be practiced as methods, systems or devices. The following detailed description is therefore not to be taken in a limiting sense.

In examples, a mobile device may have a protective operating mode used in response to one or more adverse conditions. Example mobile devices include, but are not limited to, cellular telephones, tablet computing devices, or portable media players. A mobile device may determine its current temperature is above a safe operating temperature, such that screen brightness may be reduced or a reduced level of computing power may be used in order to decrease heat produced by the device until the device temperature returns to a safe operating range. Heat generation by the device may exacerbate such adverse conditions, as may be the case when the mobile device is charging (e.g., thereby causing a battery to generate heat) or when the mobile device is used for navigation (e.g., thereby causing the screen and/or processor to generate heat).

Accordingly, aspects of the present disclosure relate to a cooled wireless mobile device charger. As an example, a cooling enclosure is provided, comprising a cooling surface. The cooling enclosure may shield or otherwise protect the mobile device from direct sunlight, thereby reducing the heat exposure of the device. While examples are described herein with respect to shielding a mobile device from sunlight, it will be appreciated that the instant aspects may similarly shield the mobile device from any of a variety of other heat sources or other adverse conditions. Additionally, the cooling surface may be angled about a lateral axis to enable a user to more easily view at least a part of the mobile device (e.g., in a landscape or portrait orientation) while the device is in the cooling enclosure. In some instances, a detachable visor is provided that further shields the mobile device from sunlight. As another example, the visor may retract within the cooling enclosure.

The cooling surface may comprise a wireless charger implementing any of a variety of wireless power transfer technologies, such as the QI wireless power transfer standard defined by the Wireless Power Consortium or the MAGSAFE wireless power transfer connector by Apple Inc. It will be appreciated that, in other examples, the cooling surface need not include a wireless charger. For example, the cooling enclosure may alternatively or additionally comprise a universal serial bus (USB) port (or, as another example, a power receptacle) to which the mobile device may be electrically connected for charging. Thus, when the mobile device is placed on the cooling surface, the mobile device may be shielded from the sun by the cooling enclosure and may further be charged and/or cooled by the cooling surface. It will be appreciated that a cooling surface need not be restricted for use with a single mobile device. For example, multiple mobile devices and/or associated accessories may be placed within and/or charged by a cooling enclosure according to aspects of the present disclosure. In such instances, the cooling surface may comprise multiple wireless chargers and/or charging ports, each of which may implement different technologies in some examples.

The cooling surface may be cooled using any of a variety of cooling means, including, but not limited to, a thermoelectric cooling element (e.g., a Peltier device) having a cold side coupled to the cooling surface and a warm side coupled to a heatsink. In some instances, the heatsink may comprise fins that are cooled using a fan or using forced air. As another example, the cooling surface may be directly coupled to a heatsink that is cooled using ambient temperature or cooled air (e.g., as may be provided from an air conditioning system of a vehicle). As a further example, the cooling surface may comprise one or more vents through which ambient or cooled air may flow. In some instances, multiple means may be used, for example depending on the temperature differential between the ambient air temperature and the temperature of the mobile device. It will be appreciated that such cooling techniques may also cool one or more wireless chargers of the cooling enclosure, thereby dissipating heat that may be generated by such wireless charging technologies.

The cooling enclosure may be a standalone enclosure or may be embedded in a dashboard, instrument cluster, or console of a vehicle, among other examples. Example vehicles include, but are not limited to, utility vehicles and recreational vehicles. For example, a utility vehicle may be a low-speed vehicle (e.g., a golf cart), a lawn mower, or a fleet vehicle. As another example, a recreational vehicle may be an all-terrain vehicle (ATV), a side-by-side (SxS) vehicle, a utility vehicle, a motorcycle, a slingshot (SLG), a snowmobile, or watercraft.

FIG. 1A illustrates a front perspective view of a cooling enclosure 100 according to aspects described herein. As illustrated, cooling enclosure 100 is embedded into surface 112. As described above, surface 112 may be part of dashboard, instrument cluster, wall, or console of a vehicle, among other examples. Cooling enclosure 100 comprises air scoop 104 through which airflow 108 is directed. For example, airflow 108 may be pulled through air scoop 104 by a fan (not pictured) beneath cooling surface 106. Mobile device 102 is illustrated as having been placed within enclosure 100 and is resting on cooling surface 106. As illustrated, cooling surface 106 comprises a set of vents through which airflow 108 may pass, thereby cooling mobile device 102. Cooling surface 106 is angled in such a way that mobile device 102 is visible within cooling enclosure 100 and is retained within cooling enclosure 100 by front wall 118.

Cooling enclosure 100 is further illustrated as comprising wireless charger 110, which charges mobile device 102. In some instances, cooling enclosure 100 further comprises a temperature sensor (not pictured) usable to determine the surface temperature of mobile device 102 and/or the temperature of wireless charger 110. The temperature sensor may thus be used to control whether mobile device 102 is charging or the rate at which mobile device 102 is charging, as well as the rate and/or type of cooling that is applied to mobile device 102 using cooling surface 106. As another example, a thermoelectric cooling element or other cooling devices may be activated when it is detected that a mobile device has been placed within cooling enclosure 110 (e.g., as may be determined when wireless charger 110 begins charging mobile device 102, based on a temperature increase, etc.).

Figure 1B:
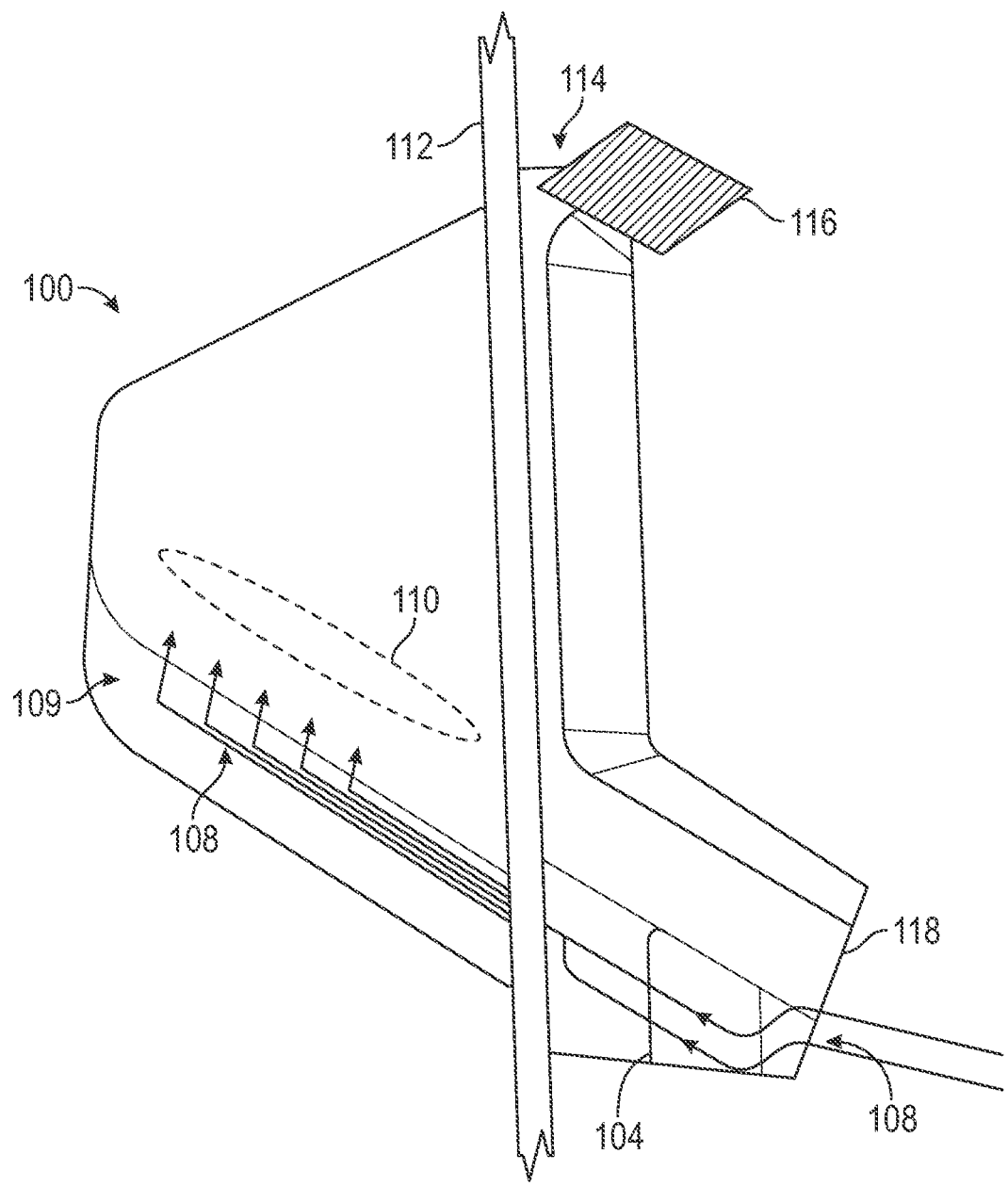
FIG. 1B illustrates a side view of a cooling enclosure according to aspects described herein.

FIG. 1B illustrates a side view of cooling enclosure 100 according to aspects described herein. Certain aspects of FIG. 1B are similar to those discussed above with respect to FIG. 1A and are therefore not necessarily re-described below in detail. As illustrated, airflow 108 passes through air scoop 104 into cooling chamber 109 and ultimately through cooling surface 106 to cool a mobile device disposed thereon.

In examples, cooling enclosure 100 further comprises visor 116. Visor 116 may be detachably coupled to the top 114 of cooling enclosure 100, for example using a set of magnets. As another example, visor 116 may retract within cooling enclosure 100. In some instances, visor 116 may be user-positionable, such that a user may adjust the angle and, as a result, the associated sun protection offered by visor 116. It will be appreciated that visor 116 need not be restricted to horizontal orientations and, in some examples, may additionally or alternatively positioned along a vertical axis of cooling enclosure 100. For example, visor 116 may be detachably coupled to a front side of cooling enclosure 100. In other examples, multiple such visors may be used.

It will be appreciated that while air scoop 104 is illustrated at the front of cooling enclosure 100 and, thus, pulling airflow 108 from the front of the enclosure, any of a variety of other configurations may be used in other examples. For example, air scoop 104 may instead be positioned at the rear of cooling enclosure 100 and may be configured to draw or otherwise receive air from a vehicle air conditioning system.

Figure 1C:
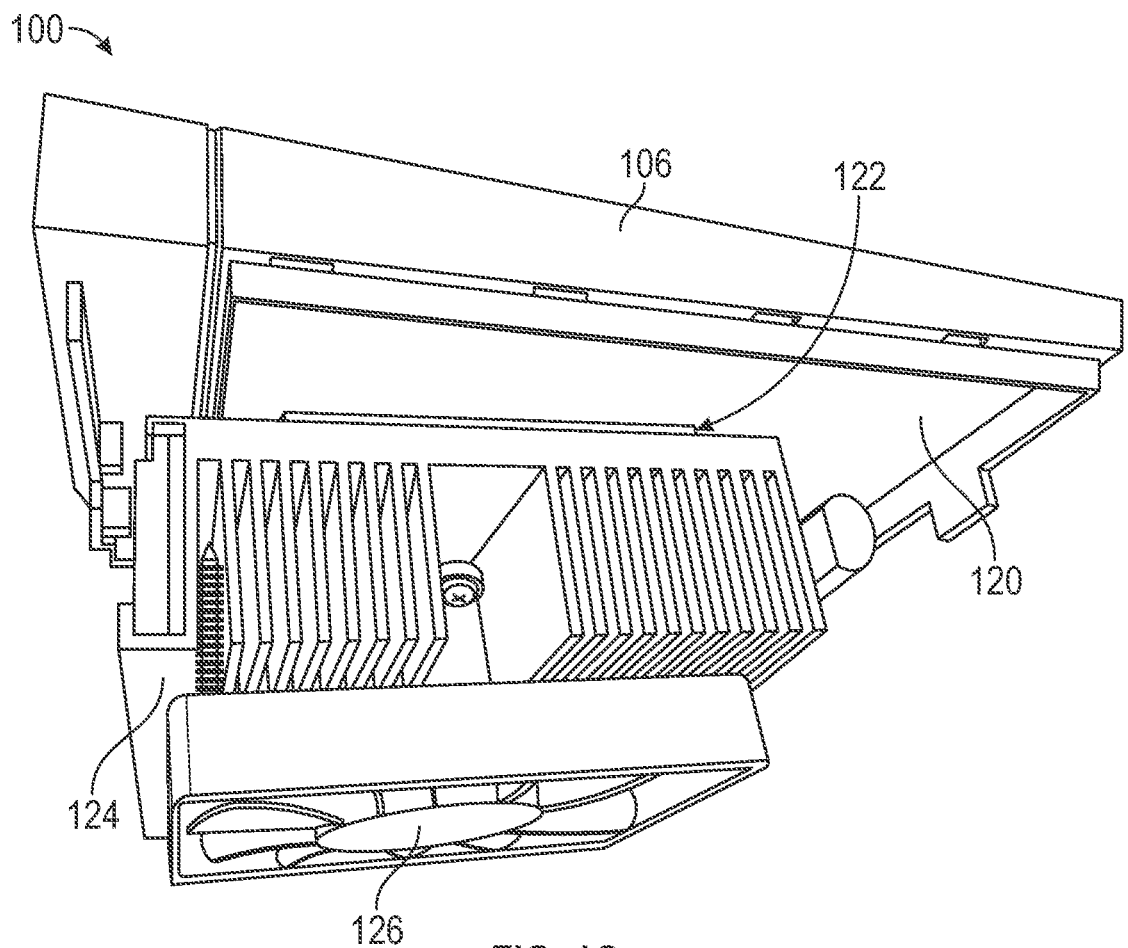
FIG. 1C illustrates a bottom side view of a cooling enclosure according to aspects described herein.

FIG. 1C illustrates a bottom side view of cooling enclosure 100 according to aspects described herein. Certain aspects of FIG. 1C are similar to those discussed above with respect to FIGS. 1A-1B and are therefore not necessarily re-described below in detail. As illustrated, thermoelectric cooling element 122 is coupled to the bottom 120 of cooling surface 106. For example, a cool side of thermoelectric cooling element 122 may be coupled to bottom 120, while heatsink 124 may be coupled to the warm side of thermoelectric cooling element 122, thereby dissipating the heat generated by thermoelectric cooling element 122 when operating to cool cooling surface 106. Fan 126 is coupled to heatsink 124 and is provided to further dissipate such heat. Thermoelectric cooling element 122, heatsink 124, and fan 126 may be disposed in cooling chamber 109 of cooling enclosure 100, as illustrated in FIG. 1B. In some instances, fan 126 may be omitted, such that heatsink 124 is passively cooled or is cooled by airflow 108, as described above.

Figure 1D:
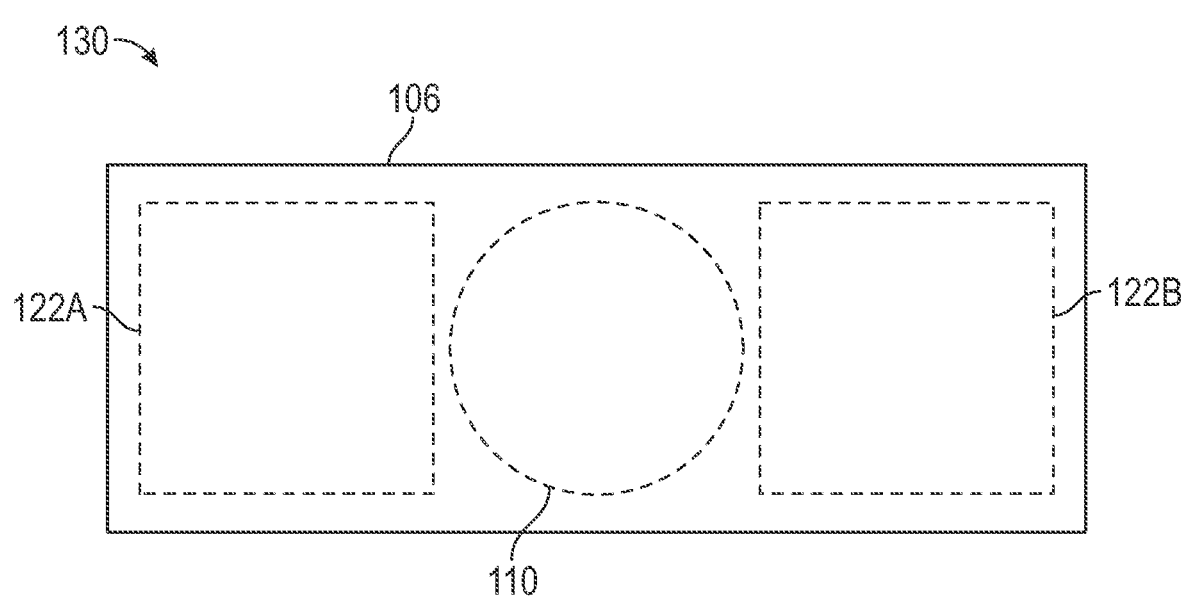
FIG. 1D illustrates a schematic view of a cooling surface for a cooling enclosure according to aspects described herein.

FIG. 1D illustrates a schematic view 130 of cooling surface 106 for cooling enclosure 100 according to aspects described herein. As illustrated, cooling surface 106 comprises thermoelectric cooling elements 122A and 122B, as well as wireless charger 110. In some instances, thermoelectric cooling elements 122A and 122B may absorb at least a part of a magnetic field generated by wireless charger 110, such that the effectiveness of wireless charger 110 is negatively impacted. Thus, thermoelectric cooling elements 122A and 122B may be positioned in a manner that does not substantially affect the performance of wireless charger 110 while still providing cooling to mobile device 102 (and, in some examples, wireless charger 110). In other examples, wireless charger 110 may be positioned between thermoelectric cooling element 122A and/or 122B and cooling surface 106, such that wireless charger 110 is cooled in addition to mobile device 102.

Wireless charger 110 and thermoelectric cooling elements 122A and 122B are illustrated using dashed lines to indicate that, in some examples, such aspects are disposed beneath cooling surface 106. For example, at least a part of cooling surface 106 may be made of a material with improved thermal conductivity, such that heat from mobile device 102 is drawn through cooling surface 106 to thermoelectric cooling elements 122A and 122B accordingly. In some instances, wireless charger 110, thermoelectric cooling element 122A, and/or thermoelectric cooling element 122B may instead be embedded within cooling surface 106, such that mobile device 102 comes into contact with such aspects when placed within cooling enclosure 100. For example, wireless charger 110 may be embedded within cooling surface 106, such that the location of wireless charger 110 is evident to a user, thereby enabling the user to correctly position mobile device 102 within charging enclosure 100 for wireless charging accordingly.

It will be appreciated that the configuration of wireless charger 110 and thermoelectric cooling elements 122A and 122B is provided as an example and that, in other instances, a different configuration may be used. For example, the configuration illustrated in schematic 130 may be favorable for landscape placement of mobile device 102. In other instances, thermoelectric cooling elements 122A and 122B may be positioned differently (e.g., to facilitate improved performance for a portrait orientation) or, as another example, additional thermoelectric cooling elements may be used. Additionally, the associated relative size, shape, and dimensions may be different in other examples and thermoelectric cooling elements and wireless chargers of the same size and/or shape need not be used. Similarly, it will be appreciated that any number of thermoelectric cooling elements and chargers may be used.

Figure 2A:
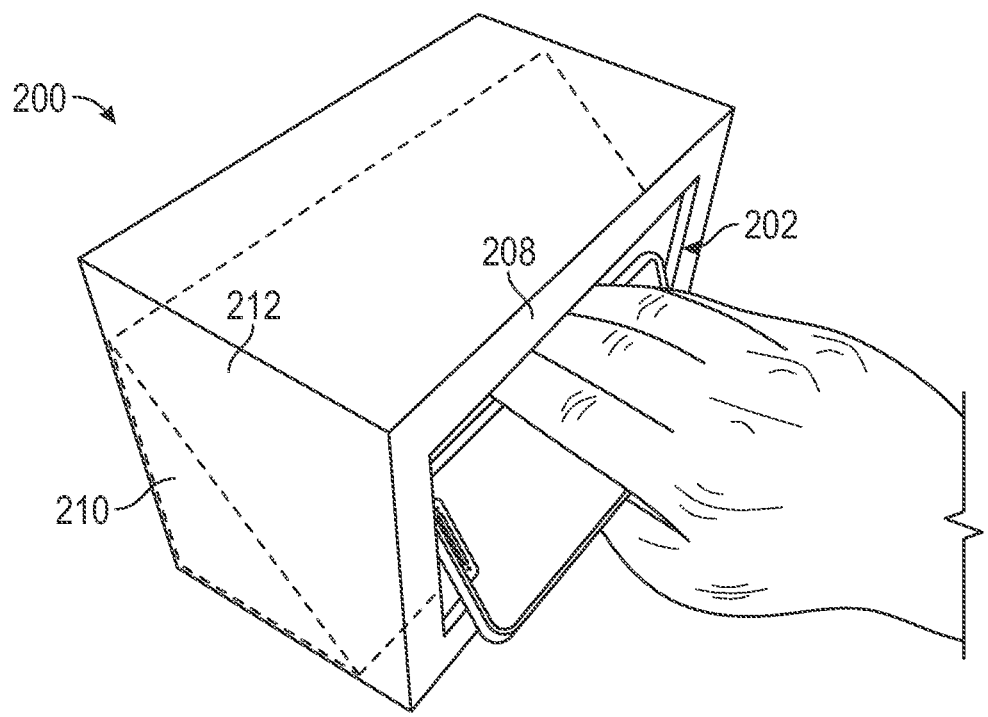
FIG. 2A illustrates a top perspective view of a cooling enclosure according to aspects described herein.
Figure 2B:
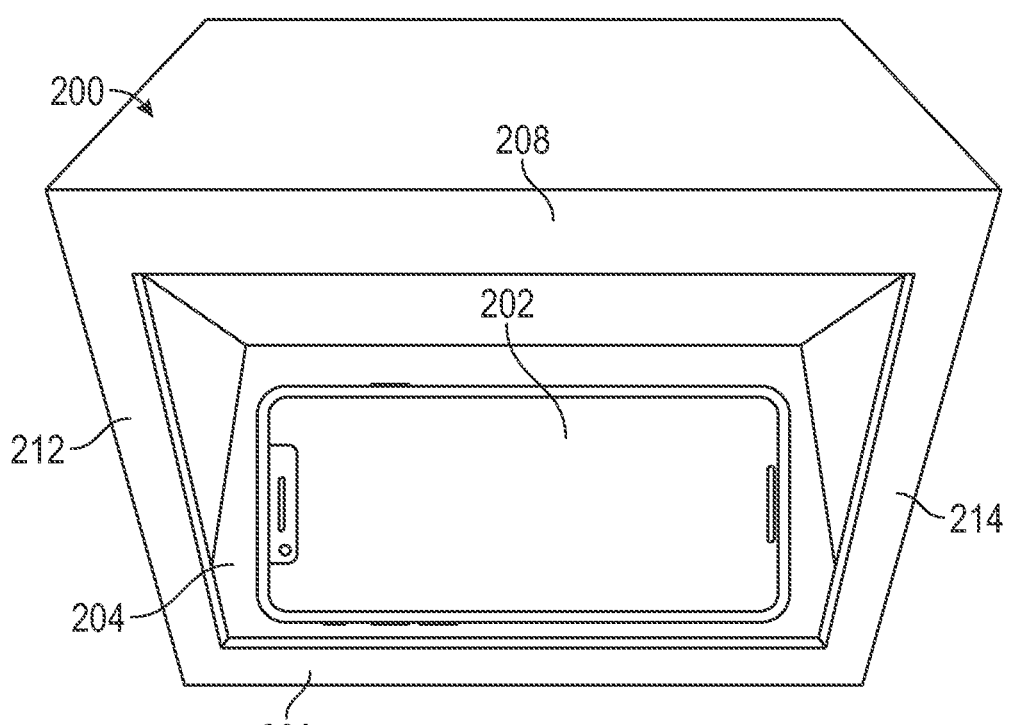
FIG. 2B illustrates a front top view of a cooling enclosure according to aspects described herein.

FIG. 2A illustrates a top perspective view of cooling enclosure 200 according to aspects described herein. FIG. 2B illustrates a front top view of cooling enclosure 200 according to aspects described herein. Cooling enclosure 200 may be a standalone example of a cooling enclosure or, as another example, may be installed or otherwise embedded into a surface, as discussed above with respect to cooling enclosure 100 in FIGS. 1A-1D. As illustrated, mobile device 202 may be placed inside cooling enclosure 200, such that visor 208 protects mobile device 202 from sunlight. Side walls 212 and 214 offer further protection from sunlight depending on the orientation of cooling enclosure 200 with respect to the sun (or any of a variety of other heat sources). As shown in FIG. 2B, cooling surface 204 positions mobile device 202 at an angle, such that it is visible while within cooling enclosure 200, thereby enabling continued use by a user. Mobile device 202 is retained within cooling enclosure 200 by front wall 206.

Cooling chamber 210 is behind cooling surface 204, as illustrated by the dashed triangle in FIG. 2A. In examples, cooling chamber 210 comprises one or more thermoelectric cooling elements, heatsinks, fans, and/or wireless chargers, as discussed above with respect to FIGS. 1A-1D. For example, cooling surface 204 may have an arrangement of thermoelectric coolers and a wireless charger similar to the arrangement shown in FIG. 1D. As an alternative to or in addition to a wireless charger, cooling enclosure 200 may comprise a charging port to enable mobile device 202 to be electrically connected to cooling enclosure 200 for charging.

Figure 3A:
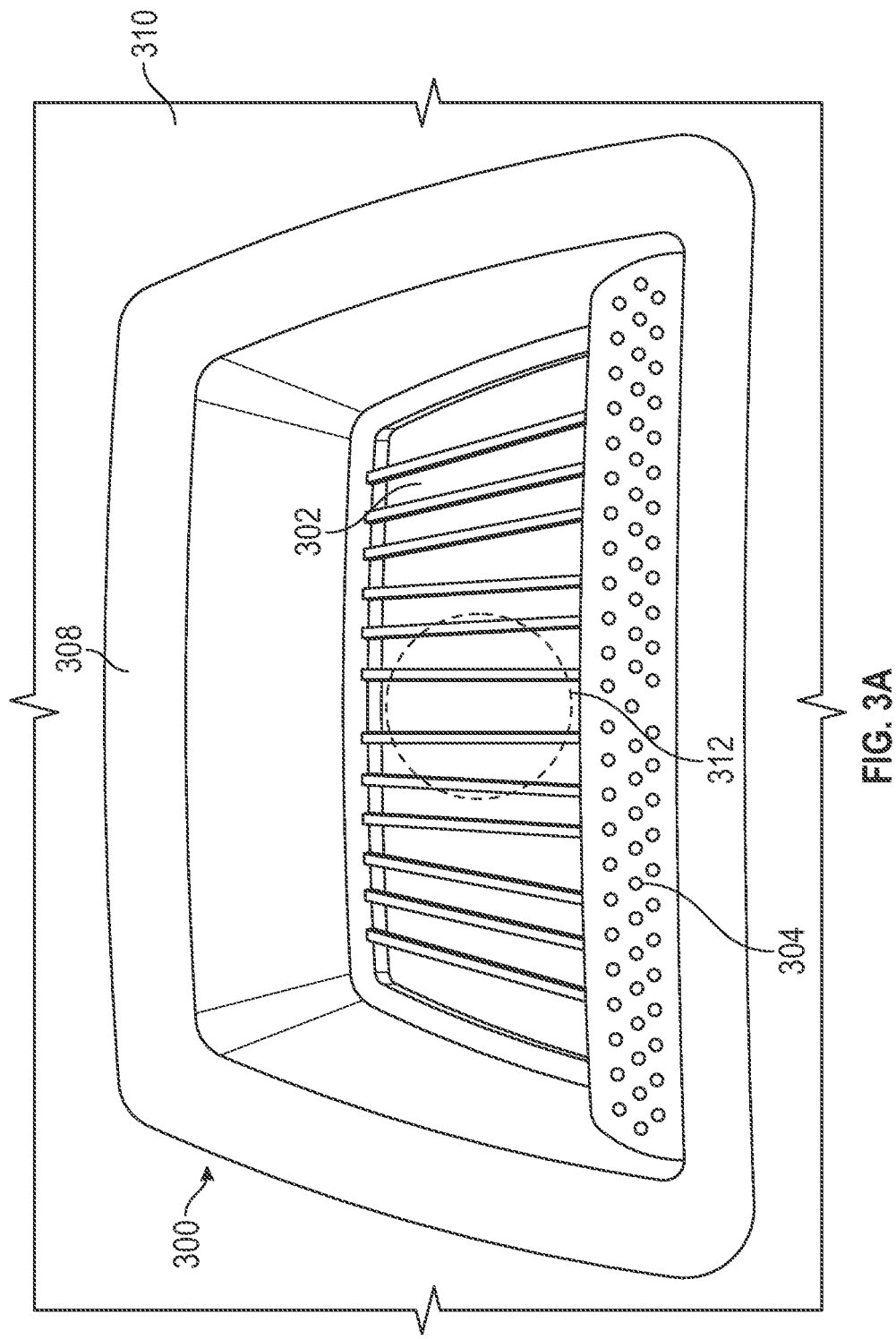
FIG. 3A illustrates a bottom front view of a cooling enclosure according to aspects described herein.

FIG. 3A illustrates a bottom front view of another cooling enclosure 300 according to aspects described herein. As illustrated, cooling enclosure 300 includes cooling surface 302, which comprises a set of vents through which air may flow to cool a mobile device placed thereon. The mobile device may be charged by wireless charger 312 according to aspects described herein. A mobile device may be retained on cooling surface 302 by front wall 304. As illustrated, front wall 304 comprises a series of holes, thereby further enabling airflow around the mobile device to facilitate cooling.

It will be appreciated that the vents of cooling surface 302 and the holes of front wall 304 are provided as examples and, in other examples, any of a variety of other sizes, configurations, and/or patterns may be used. The top 308 of cooling enclosure 300 may be configured to receive a removable visor, such as visor 116 discussed above with respect to FIG. 1B. As illustrated, cooling enclosure 300 is embedded into surface 310, such that cooling surface 302 is recessed within surface 310, thereby enabling convenient and protected storage and charging of a mobile device. As described above, surface 310 may be part of dashboard, instrument cluster, or console of a vehicle, among other examples.

Figure 3C:
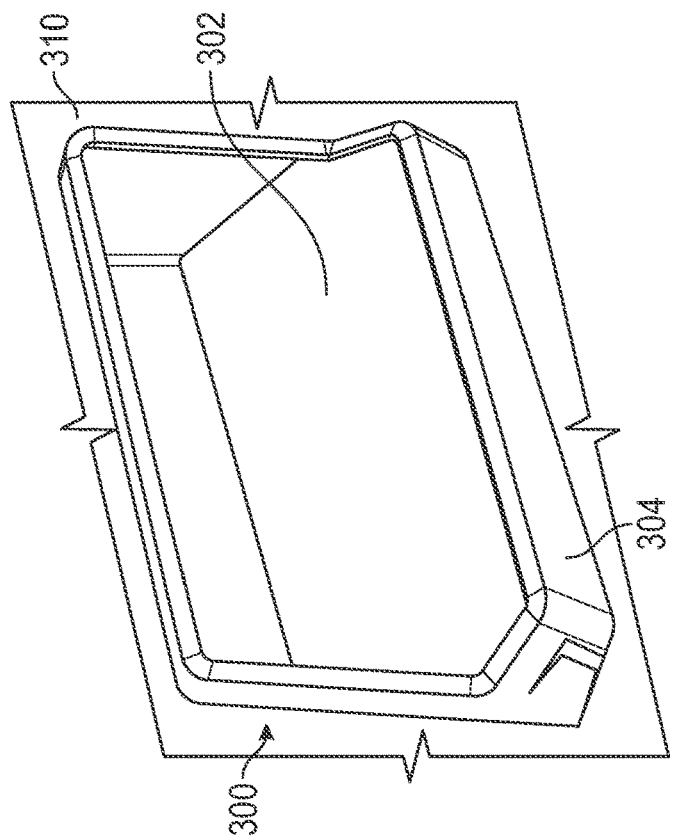
FIGS. 3B and 3C illustrate alternative design examples for a cooling enclosure according to aspects described herein.
Figure 3B:
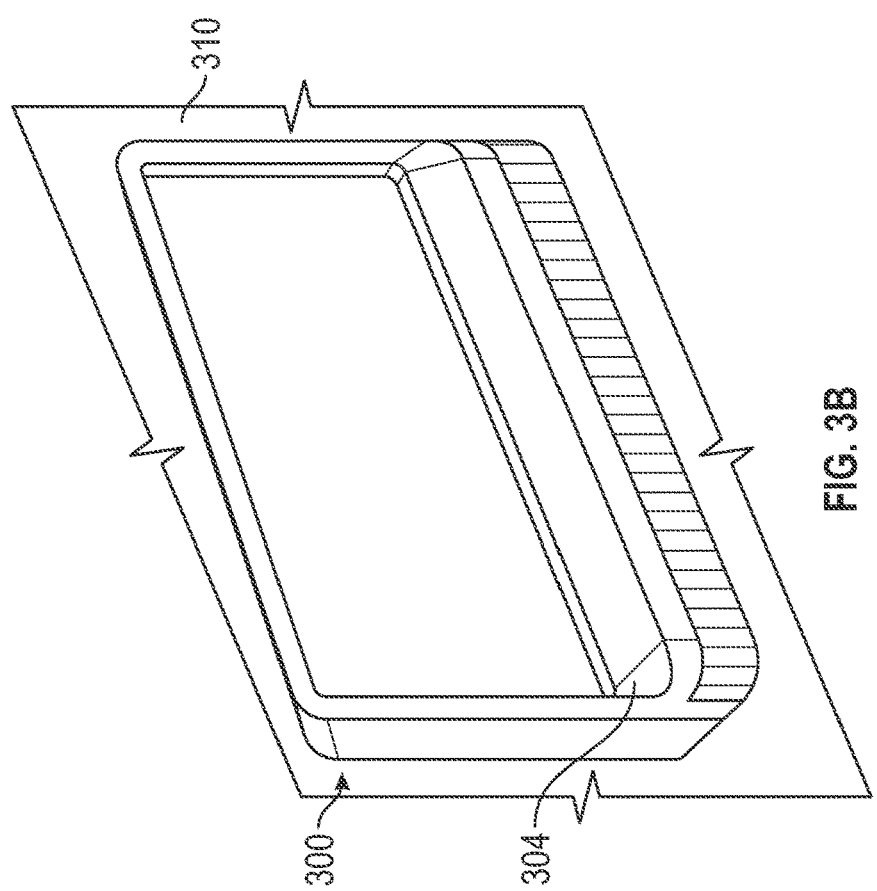

FIGS. 3B and 3C illustrate alternative design examples for cooling enclosure 300 according to aspects described herein. As shown in FIG. 3B front wall 304 may be substantially parallel to surface 310, which may offer greater protection for a mobile device placed within cooling enclosure 300, potentially with reduced visibility. By contrast, FIG. 3C illustrates an example in which front wall 304 gradually angles away from surface 310 along the vertical axis, such that a mobile device placed on cooling surface 302 has greater visibility from outside cooling enclosure 300.

Figure 4:
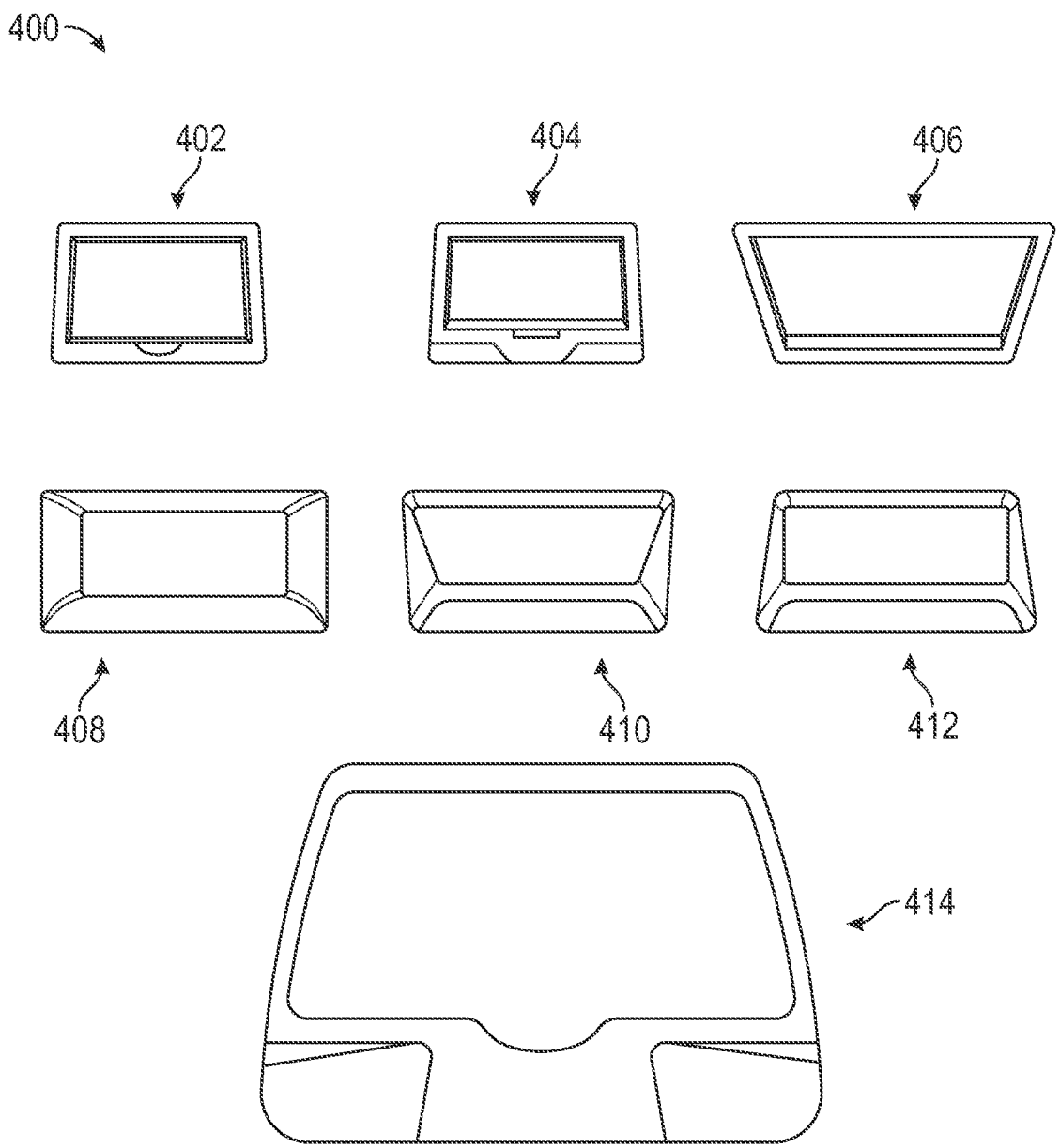
FIG. 4 illustrates alternative design examples for cooling enclosures according to aspects described herein.

FIG. 4 illustrates alternative design examples 400 for cooling enclosures according to aspects described herein. Thus, it will be appreciated that a cooling enclosure according to aspects described herein may have any of a variety of appearances or, in some instances, may have interchangeable faceplates, such that the appearance of the cooling enclosure may be adapted to the environment in which it is embedded. For instances, faceplates 402, 404, and 414 each comprise a depression in the center of the front wall, thereby enabling easier access to a mobile device placed therein. As another example, front plates 406, 408, 410, and 412 each have different-shaped openings through which to view a mobile device placed on the cooling surface, as may be the case with cooling enclosures designed for different devices (e.g., according to size, type, or aspect ratio).

In other examples, a cooling enclosure may be partitioned, such that each partition is configured to charge and/or cool a mobile device separate from one or more other mobile devices placed within the cooling enclosure. For example, an interior wall may extend along the vertical axis of the cooling enclosure or, as another example, the cooling surface may have one or more protrusions that cause mobile devices therein to remain separated.

The description and illustration of one or more aspects provided in this application are not intended to limit or restrict the scope of the disclosure as claimed in any way. The aspects, examples, and details provided in this application are considered sufficient to convey possession and enable others to make and use the best mode of claimed disclosure. The claimed disclosure should not be construed as being limited to any aspect, example, or detail provided in this application. Regardless of whether shown and described in combination or separately, the various features (both structural and methodological) are intended to be selectively included or omitted to produce an embodiment with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

What is claimed is:

1. A cooling enclosure for a mobile device, comprising:
   a top configured to detachably couple with a visor;
   a cooling surface having a bottom side and a top side, wherein the top side is configured to receive the mobile device;
   a cooling means coupled to the bottom of the cooling surface; and
   a wireless charger coupled to the bottom of the cooling surface, the wireless charger configured to charge the mobile device.

2. The cooling enclosure of claim 1, wherein the cooling enclosure further comprises:
   an air scoop configured to receive an airflow; and
   the cooling means comprises a set of vents through which the airflow is directed to cool the mobile device.

3. The cooling enclosure of claim 2, wherein the air scoop is configured to receive the airflow from an air conditioning system of a vehicle.

4. The cooling enclosure of claim 1, wherein the cooling means is a thermoelectric cooling element disposed within a cooling chamber of the cooling enclosure.

5. The cooling enclosure of claim 4, wherein the thermoelectric cooling element is configured to cool the mobile device when it is detected that the mobile device is placed within the cooling enclosure.

6. The cooling enclosure of claim 4, wherein the cooling enclosure further comprises:
   a heatsink coupled to the thermoelectric cooling element; and
   a fan disposed within the cooling chamber.

7. The cooling enclosure of claim 1, wherein the cooling enclosure is embedded within a dashboard, an instrument cluster, or a console of a vehicle.

8. The cooling enclosure of claim 1, wherein the cooling surface is rotated about a lateral axis of the cooling enclosure, thereby retaining the mobile device at an angle within the cooling enclosure.

9. The cooling enclosure of claim 1, wherein the top is configured to magnetically receive the visor.

10. A cooling enclosure for a mobile device, comprising:
    a top configured to magnetically receive a visor;
    a cooling surface rotated about a lateral axis of the cooling enclosure to retain the mobile device at an angle within the cooling enclosure, the cooling surface having a bottom side and a top side, wherein the top side of the cooling surface is configured to receive the mobile device;
    a wireless charger coupled to the bottom of the cooling surface, the wireless charger configured to charge the mobile device;
    a thermoelectric cooling element coupled to the bottom of the cooling surface;
    a heatsink coupled to the thermoelectric cooling element; and
    a fan disposed within a cooling chamber of the cooling enclosure.

11. The cooling enclosure of claim 10, wherein the thermoelectric cooling element is configured to cool the mobile device when it is detected that the mobile device is placed within the cooling enclosure.

12. The cooling enclosure of claim 10, wherein the cooling enclosure is embedded within a dashboard, an instrument cluster, or a console of a vehicle.

13. The cooling enclosure of claim 10, wherein the cooling chamber is configured to receive an airflow from an air conditioning system of a vehicle.

14. The cooling enclosure of claim 10, further comprising a power receptacle configured to provide an electrical connection for a charging cable of the mobile device.

15. A cooling enclosure for a mobile device, comprising:
    a cooling surface having a bottom side and a top side, wherein the top side is configured to receive the mobile device and the cooling surface is rotated about a lateral axis of the cooling enclosure, thereby retaining the mobile device at an angle within the cooling enclosure;
    a thermoelectric cooling element disposed within a cooling chamber of the cooling enclosure and coupled to the bottom of the cooling surface; and
    at least one of:
      a wireless charger coupled to the bottom of the cooling surface, the wireless charger configured to charge the mobile device; or
      a power receptacle configured to provide an electrical connection for a charging cable of the mobile device.

16. The cooling enclosure of claim 15, wherein the cooling enclosure further comprises:
    an air scoop configured to receive an airflow from an air conditioning system of a vehicle; and
    the cooling means comprises a set of vents through which the airflow is directed to cool the mobile device.

17. The cooling enclosure of claim 15, wherein the thermoelectric cooling element is configured to cool the mobile device when it is detected that the mobile device is placed within the cooling enclosure.

18. The cooling enclosure of claim 15, wherein the cooling enclosure further comprises:
    a heatsink coupled to the thermoelectric cooling element; and
    a fan disposed within the cooling chamber.

19. The cooling enclosure of claim 15, wherein the cooling enclosure is embedded within a dashboard, an instrument cluster, or a console of a vehicle.

20. The cooling enclosure of claim 15, wherein the thermoelectric cooling element cools the mobile device when power is supplied to the thermoelectric cooling element.

* * * * *